(12) United States Patent
Vazhenin et al.

(10) Patent No.: US 9,191,048 B2
(45) Date of Patent: Nov. 17, 2015

(54) QUADRATURE IMPULSE NOISE REMOVER

(71) Applicant: Topcon Positioning Systems, Inc., Livermore, CA (US)

(72) Inventors: Nickolay A. Vazhenin, Moscow (RU); Alexey S. Volkovskiy, Moscow (RU); Timur G. Kelin, Moscow (RU)

(73) Assignee: Topcon Positioning Systems, Inc., Livermore, CA (US)

( * ) Notice: Subject to any disclaimer, the term of this patent is extended or adjusted under 35 U.S.C. 154(b) by 0 days.

(21) Appl. No.: 14/343,641

(22) PCT Filed: Dec. 13, 2012

(86) PCT No.: PCT/US2012/069530
§ 371 (c)(1),
(2) Date: Mar. 7, 2014

(87) PCT Pub. No.: WO2013/090593
PCT Pub. Date: Jun. 20, 2013

(65) Prior Publication Data
US 2014/0226769 A1    Aug. 14, 2014

(30) Foreign Application Priority Data
Dec. 14, 2011 (RU) ............... 2011150834

(51) Int. Cl.
*H03D 1/04* (2006.01)
*H04L 1/00* (2006.01)
*H04B 1/10* (2006.01)
*H04B 1/12* (2006.01)
*H03G 3/34* (2006.01)
*H04B 1/30* (2006.01)

(52) U.S. Cl.
CPC ............ *H04B 1/12* (2013.01); *H03G 3/345* (2013.01); *H04B 1/30* (2013.01)

(58) Field of Classification Search
CPC ............... H04L 1/0072; H04L 2001/0093; H04B 1/10; H04D 1/06
USPC ............ 375/348, 148–153, 343, 345–346
See application file for complete search history.

(56) References Cited

U.S. PATENT DOCUMENTS

| | | | | |
|---|---|---|---|---|
| 4,311,963 A | * | 1/1982 | Watanabe et al. | 327/310 |
| 5,212,827 A | * | 5/1993 | Meszko et al. | 455/219 |
| 5,826,180 A | * | 10/1998 | Golan | 455/302 |
| 6,577,851 B1 | * | 6/2003 | Ecklund et al. | 455/223 |
| 7,103,122 B2 | | 9/2006 | Suganuma | |
| 7,236,545 B2 | | 6/2007 | Kolze | |

(Continued)

FOREIGN PATENT DOCUMENTS

| RU | 2100903 C1 | 12/1997 |
|---|---|---|
| RU | 2107404 C1 | 3/1998 |

OTHER PUBLICATIONS

International Search Report dated Mar. 26, 2013 from International Patent Application No. PCT/US2012/069530 filed Dec. 12, 2012; pp. 1-4.

(Continued)

*Primary Examiner* — Qutbuddin Ghulamali
(74) *Attorney, Agent, or Firm* — Chiesa Shahinian & Giantomasi PC

(57) ABSTRACT

A method and system for signal reception and processing, and more particularly for reducing the effects of random additive impulse interference is provided.

22 Claims, 11 Drawing Sheets

(56) References Cited

U.S. PATENT DOCUMENTS

| | | |
|---|---|---|
| 7,573,959 B2 | 8/2009 | Hsiung et al. |
| 7,706,542 B2 | 4/2010 | Suganuma |
| 2004/0235445 A1 | 11/2004 | Gomez |

OTHER PUBLICATIONS

Written Opinion dated Mar. 26, 2013 from International Patent Application No. PCT/US2012/069530 filed Dec. 12, 2012; pp. 1-5.

* cited by examiner

QUADRATURE IMPULSE NOISE REMOVER

RELATED APPLICATIONS

This application claims priority from Russian Patent Application No. 2011150834, filed on Dec. 14, 2011, which is incorporated herein by reference.

BACKGROUND OF THE INVENTION

The present invention relates generally to digital systems for signal reception and processing, and more particularly for reducing the effects of random additive impulse interference.

Radio communication and location systems are susceptible to various forms of noise that can disrupt signal reception. Random impulse noise, which comprises one or more pulses with relatively high amplitude and short duration, is a commonly encountered noise. Generally speaking, sources of random impulse noise include microwave ovens, washing machines, light switches, car engines, and other electrical machines. Severe impulse noise can degrade signal reception quality and cause burst errors to occur. To ensure quality signal reception, system designers often install an apparatus in the receiving path of a receiver to detect impulse noise and remove it. However, since impulse noise can have various different properties, detection of impulse noise is a complex task. In the related art, there are known methods and apparatuses designed for negating random impulse interference. For example, in U.S. Pat. No. 7,706,542 the device contains a Noise Extraction Unit, a Hold Unit, a Noise Smoothing Unit, a Hold Control Signal Generation Unit, a Low Pass Filter, a Comparator, and an Absolute Value Circuit; however, the device is intended for removing impulse noise whose duration is much less than the period of the carrier or intermediate frequency. In addition, the device cannot be directly used in radio systems with digital modulation. Further, U.S. Pat. No. 7,103,122 discloses a noise canceller which includes a Noise Detector, a Switch, a Hold Circuit, and other components. In this patent the duration of noise is assumed to be much less than the period of the carrier oscillation. Strobe and impulse noise processing units of a Synchronous Code Division Multiple Access (SCDMA) system (Chip Blanking and Processing in SCDMA to Mitigate Impulse and Burst Noise and/or Distortion), described in U.S. Pat. Nos. 7,573,959 and 7,236,545, contain a Delay Block and a Impulse Noise Detection Block; however, such units are designed to remove impulse noise with a limited duration.

SUMMARY OF THE INVENTION

The present disclosure relates generally to digital systems for signal reception and processing, and more particularly for reducing the effects of random additive impulse interference. Specifically, the present disclosure is directed at receiving, by a first low pass filter, an input in-phase signal comprising a predetermined in-phase signal and first impulse noise; generating, by the first low pass filter, a filtered input in-phase signal; receiving, by a second low pass filter, an input quadrature signal comprising a predetermined quadrature signal and second impulse noise; generating, by the second low pass filter, a filtered input quadrature signal; receiving, by a noise detection unit, the filtered in-phase signal and the filtered quadrature signal; based on the filtered in-phase signal and the filtered quadrature signal, generating, by the noise detection unit, a control signal; receiving, by a first channel impulse noise remover, the filtered in-phase signal and the control signal; based on the control signal, removing, by the first channel impulse noise remover, the first impulse noise from the filtered in-phase signal and output the predetermined in-phase signal; receiving, by a second channel impulse noise remover, the filtered quadrature signal; receiving, by the second channel impulse noise remover, the control signal; and based on the control signal, removing, by the second channel impulse noise remover, the first impulse noise from the filtered quadrature signal and output the predetermined quadrature signal.

These and other advantages of the invention will be apparent to those of ordinary skill in the art by reference to the following detailed description and the accompanying drawings.

DETAILED DESCRIPTION

Modern digital radio communication, location and navigation systems include an impulse-noise-removing system to mitigate the effects of random impulse interference within an in-phase channel and within a quadrature channel. An in-phase signal is a signal multiplied by a reference signal. A quadrature signal is a signal multiplied by a reference signal shifted 90° out of phase. In an embodiment of the invention, the reference signal within the in-phase channel is a cosine signal; the reference signal within the quadrature channel is a sine signal.

Figure 1:
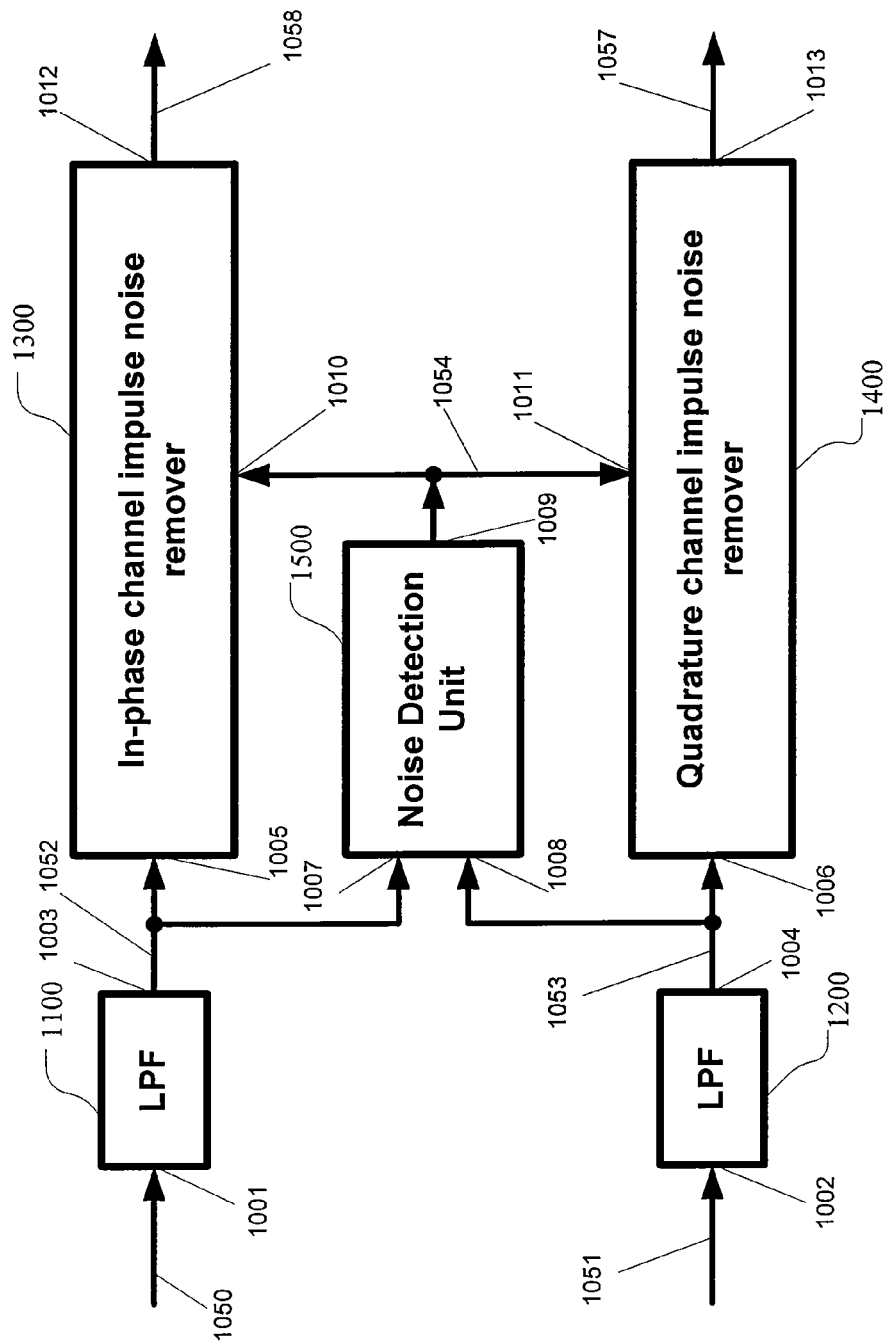
FIG. 1 illustrates an impulse noise remover, according to a first embodiment.

FIG. 1 illustrates a quadrature impulse noise remover system 1000, according to a first embodiment of the invention. System 1000 includes low pass filter (LPF) 1100 of in-phase channel, LPF 1200 of quadrature phase channel, impulse noise remover 1300 of in-phase channel, impulse noise remover 1400 of quadrature phase channel and a noise detection unit 1500. To suppress impulse interference in an in-phase signal, an in-phase signal is processed by system 1000 as follows: signal 1050 is fed, via port 1001, to LPF 1100 which attenuates signal 1050 if signal 1050 has frequency higher than the cutoff frequency. Filtered signal 1052 is then outputted from LPF 1100 via output port 1003 and fed, in parallel, to input port 1005 of the impulse noise remover 1300 of in-phase channel and to input port 1007 of the noise detection unit 1500. In an embodiment, impulse noise removers are configured to suppress impulse noise with impulse duration less than the duration of channel impulses of the desired signal, so the bandwidth of respective LPFs are selected considering minimal distortion of noise impulses and maximal filtration of additive white Gaussian noise (WGN). In other words, the LPF bandwidth is required to match the spectrum of expected impulse interference.

Based on the analysis of the received in-phase signal 1052, the noise detection unit 1500 generates a control signal 1054 which is synchronized in time with detected noise impulses. The control signal 1054 is then outputted from the noise detection unit 1500 via output port 1009 and fed to input port 1010 of the impulse noise remover 1300 of in-phase channel and to input port 1011 of the impulse noise remover 1400 of quadrature phase channel 1400. In the impulse noise remover 1300 of in-phase channel, signals fed via ports 1005 and 1010 are compared and the detected noise is suppressed. Then, signal 1058 with suppressed impulse interference is outputted, via output port 1012, from the impulse noise remover 1300 of in-phase channel. Further details of the impulse noise remover 1300 of in-phase channel and noise detection unit 1500 are discussed below.

To suppress impulse interference in a quadrature phase signal, a quadrature phase signal is processed by system 1000 as follows: signal 1051 is fed, via port 1002, to LPF 1200 which attenuates signal 1051 if signal 1051 has frequency higher than the cutoff frequency. Filtered signal 1053 is then outputted from LPF 1200 via output port 1004 and fed, in parallel, to input port 1006 of the impulse noise remover 1400 of quadrature phase channel and to input port 1008 of the noise detection unit 1500.

Based on the analysis of the received quadrature phase signal 1053, the noise detection unit 1500 generates a control signal 1054 which is synchronized in time with detected noise impulses. The control signal 1054 is then outputted, via output port 1009, from the noise detection unit 1500 and fed to input port 1010 of the impulse noise remover 1400 of in-phase channel and to input port 1011 of the impulse noise remover 1400 of quadrature phase channel. In the impulse noise remover 1400 of quadrature phase channel, signals fed via ports 1007 and 1011 are compared and the detected noise is suppressed. Then, signal 1057 with suppressed impulse interference is outputted, via output port 1013, from the impulse noise remover 1300 of quadrature phase channel. Further details of the impulse noise remover 1400 of quadrature phase channel are discussed below.

It is to be understood that the system 1000 of FIG. 1 can process the in-phase signal and the quadrature phase signal either asynchronously or synchronously. It is to be understood that, generally pulse interference may occur in both in-phase channel and in quadrature channel simultaneously; however, as a level of interference can be different in both channels, the interference can be detected in each channel independently. Accordingly, in an embodiment of the present invention, an interference compensation is implemented in both in-phase channel and in quadrature channel notwithstanding the fact that interference may be detected only in one of the two channels.

Figure 2:
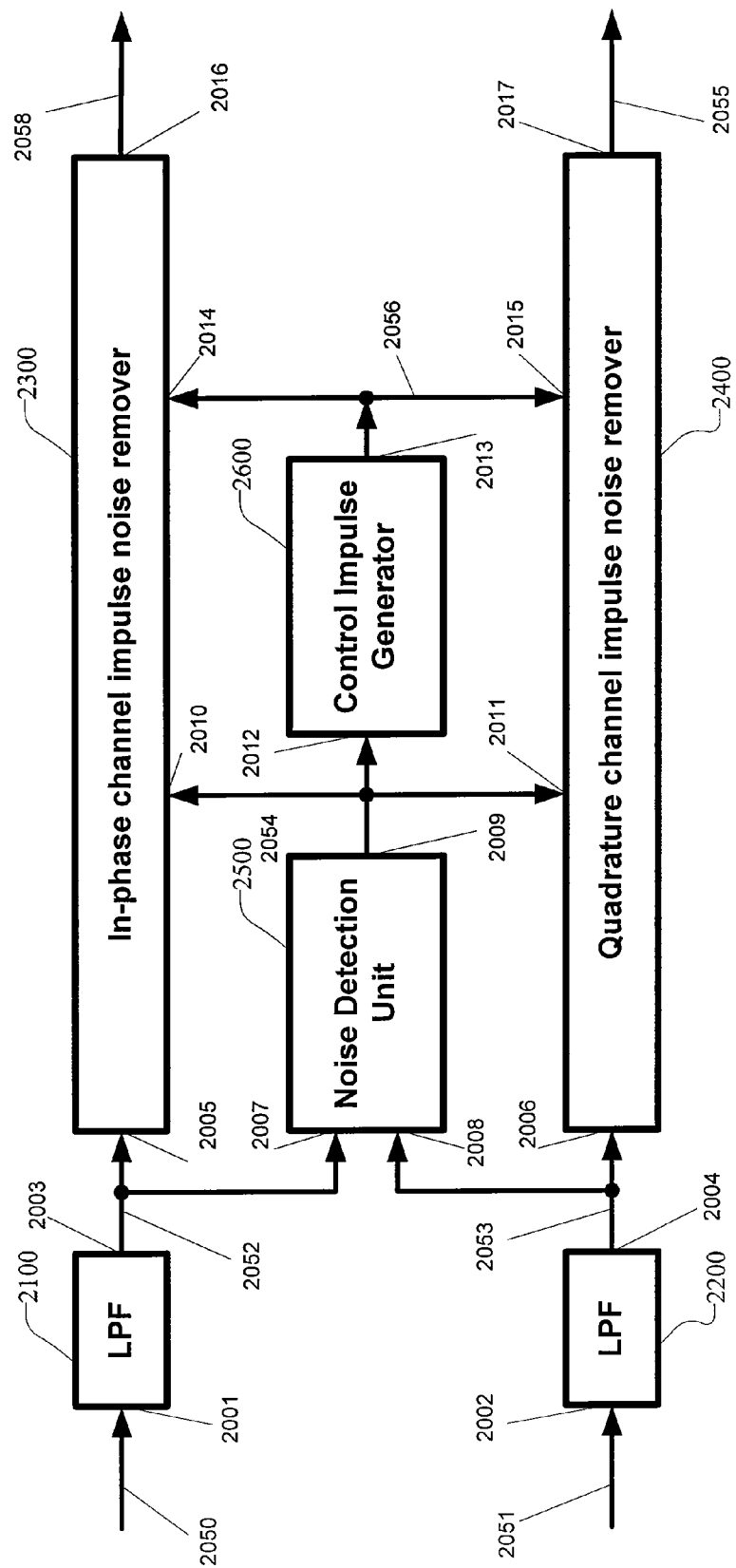
FIG. 2 illustrates an impulse noise remover, according to a second embodiment.

FIG. 2 illustrates a second embodiment of the quadrature impulse noise remover system 2000 which includes LPF 2100 of in-phase channel, LPF 2200 of quadrature phase channel, impulse noise remover 2300 of in-phase channel, impulse noise remover 2400 of quadrature phase channel, a noise detection unit 2500, and a control impulse generator 2600.

To suppress impulse interference in an in-phase signal, an in-phase signal is processed by system 2000 as follows: signal 2050 is fed, via port 2001, to LPF 2100 which attenuates signal 2050 if signal 2050 has frequency higher than the cutoff frequency. Attenuated signal 2052 is then outputted, via output port 2003, from LPF 2100 and fed, in parallel, to input port 2005 of the impulse noise remover 2300 of in-phase channel and to input port 2007 of the noise detection unit 2500.

Based on the analysis of the received in-phase signal 1052, the noise detection unit 2500 generates a control signal 2054 which is synchronized in time with detected noise impulses. The control signal 2054 is then outputted, via output port 2009, from the noise detection unit 2500 and fed to the impulse noise remover 2300 of in-phase channel via input port 2010, to the impulse noise remover 2400 of quadrature phase channel input port 2011, and to a control impulse generator 2600 via input port 2012. The control impulse generator 2600 generates additional control signal 2056 which is outputted from the control impulse generator 2600 via output port 2013 and fed, via input 2014, to the impulse noise remover 2300 of the in-phase channel and to the impulse noise remover 2400 of the quadrature phase channel.

Figure 3:
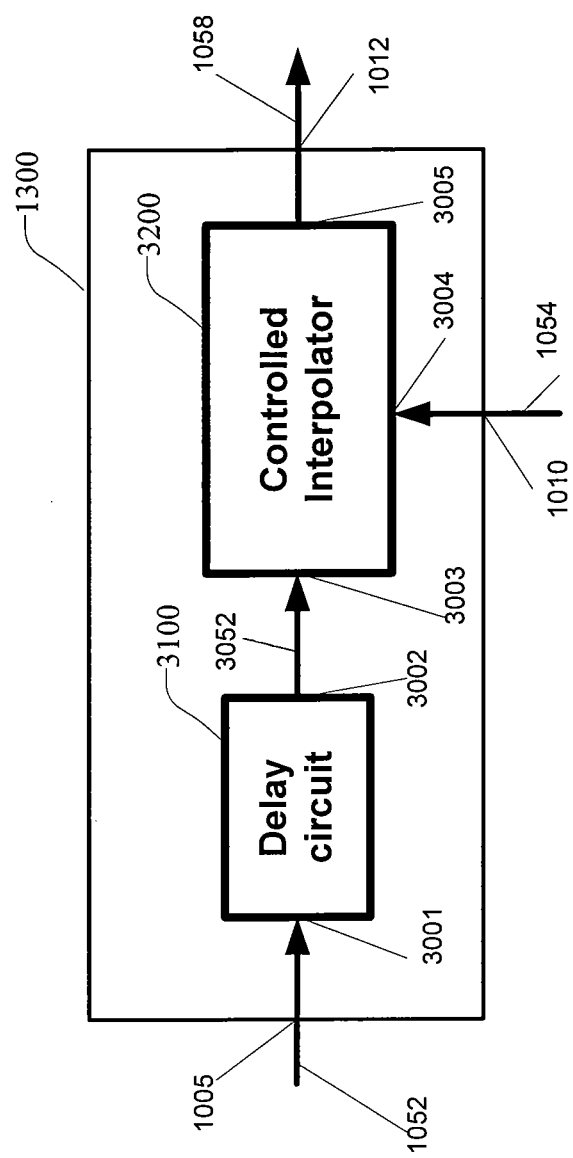
FIG. 3 illustrates an embodiment of a channel impulse noise remover.

FIG. 3 illustrates an embodiment of an impulse noise remover 1300 of FIG. 1. The impulse noise remover 1300 includes two sequentially-connected units: a delay circuit 3100 and a controlled interpolator 3200 where signal 3050 is fed to the impulse noise remover 1300 via input port 3001 of the delay circuit 3100. Signals are processed in the impulse noise remover 3000 as follows: signal 3052 is outputted from the delay circuit 3100 via output port 3002 and fed to input port 3003 of the controlled interpolator 3200. Further, signal 3054 is inputted to the impulse noise remover 1300 via input port 3004 of the controlled interpolator 3200. Signal 3058 is outputted from the impulse noise remover 1300 via output port 3005 of the controlled interpolator 3200. It is to be understood the similar signal processing is applicable for impulse noise remover 1400 of FIG. 1.

In an embodiment, delay time in the delay circuit 3100 is selected equal to the signal delay in the noise detection unit 1500 of FIG. 1. The controlled interpolator 3200 generates the impulse interference of a finite duration in accordance with the control signal being fed to impulse noise remover, via the delay circuit 3100 and the controlled interpolator 3200. During impulse interference the behavior of the signal is determined by interpolating the received signal using a zero-order interpolator. In an embodiment, zero or first order interpolators are used to determine the behavior of the signal.

Figure 4:
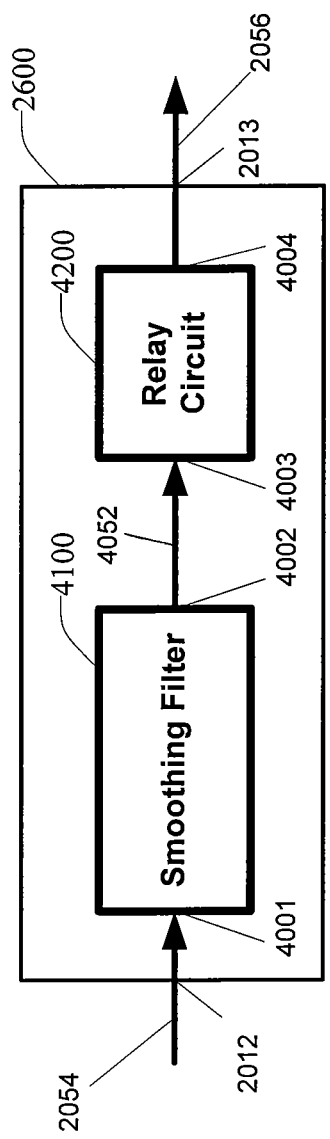
FIG. 4 illustrates an embodiment of a controlled impulse generator.

FIG. 4 illustrates a controlled impulse generator 2600 of FIG. 2. According to an embodiment, the controlled impulse generator 2600 includes sequentially connected smoothing filter 4100 and relay circuit 4200 where input signal 2054 is imputed to the controlled impulse generator via input port 4001 of the smoothing filter 4100. Signals are processed in the controlled impulse generator 2600 as follows: Signal 4052 is outputted from the smoothing filter 4100 via output port 4002 and fed to input port 4003 of the relay circuit 4200. Signal 4056 is outputted from the controlled impulse generator 2600 via output port 4004 of the relay circuit 4200. In an embodiment, the controlled impulse generator 2600 is configured to generate a "window" where or during which a fragment of the received signal is replaced by a function obtained from the smoothed signal. In this smoothed signal the impulse interference has been compensated by a zero-order interpolator. In an embodiment, a rectangular impulse, duration of which is equal to the duration of the window where a fragment of the received signal has been replaced by the signal from the output of the smoothing filter 4100, is generated at the output port 4004 of the relay circuit 4200.

Figure 5:
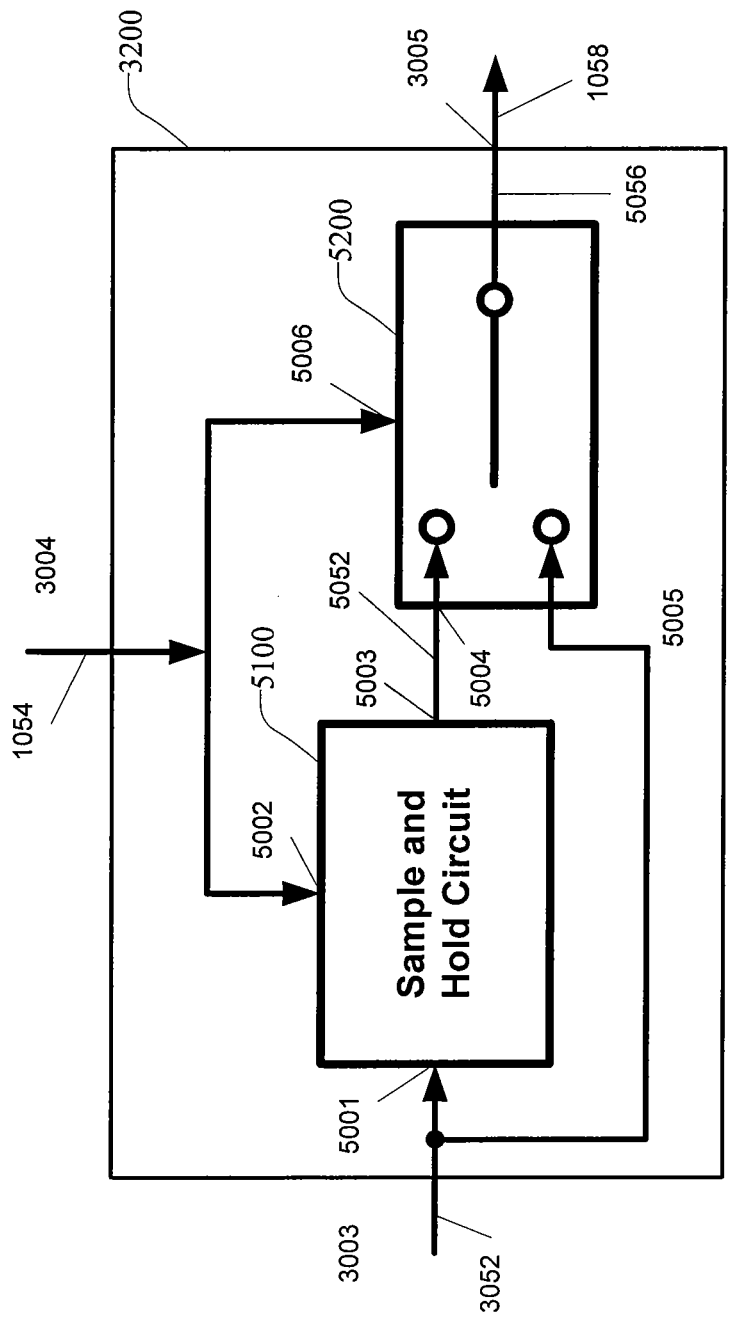
FIG. 5 illustrates an embodiment of a controlled interpolator.

FIG. 5 illustrates a controlled interpolator 3200 of FIG. 3. The controlled interpolator 3200 includes a sample and hold unit 5100 and a switch 5200. The signal is processed by the controlled interpolator 3200 as follows: input signal 3052 is inputted, in parallel, to the controlled interpolator through input port 5001 of the sample and hold circuit 5100 and to input port 5005 of the switch 5200. Input signal 5054 is inputted to the controlled interpolator 5000 via input port 5030 and fed, in parallel, to the sample and hold circuit 5100 via input port 5002 and to the switch 5200 via input port 5006. Signal 5052 is outputted from the sample and hold circuit 5100 via output port 5003 and fed to the switch 5200 via input port 5004. Signal is outputted from the controlled interpolator 3200 via output port 5020 of the switch 5200 and corresponds to a signal 1058 of FIG. 1.

In an embodiment, when a zero-order interpolation algorithm is applied, the input signal 1054 of FIG. 1 comprising a mixture of the desired signal (for example, Binary Phase Shift Keying (BPSK)—modulated, Additive White Gaussian Noise (AWGN)) and random impulse noise are fed to the channel impulse noise remover 1300 of FIG. 1 via input port 5005 of the switch 5200 and to the input port 5001 of the Sample and Hold Unit 5100 of the controlled interpolator 3200. With the absence of impulse noise, the received signal is fed, via input port 5005 of the switch 5200, to output port 5056 of the switch 5200.

When the control signal is fed to input port 3004 of controlled interpolator 3200, a processor of the sample and hold unit 5100 stores the value of the received signal and transmits it to input port 5004 of the switch 5200 (input port 5004 being set to "reading" mode). Once the control signal at input port 3003 of controlled interpolator 3200 is re-set to "logic zero" (i.e., switched off), the switch 5200 is reset to have its input port 5005 to be set to "reading" mode. Thus, during noise impulse the level of the signal at the output port 3005 of controlled interpolator 3200 remains fixed and thereby impulse noise effects become essentially reduced.

Figure 6:
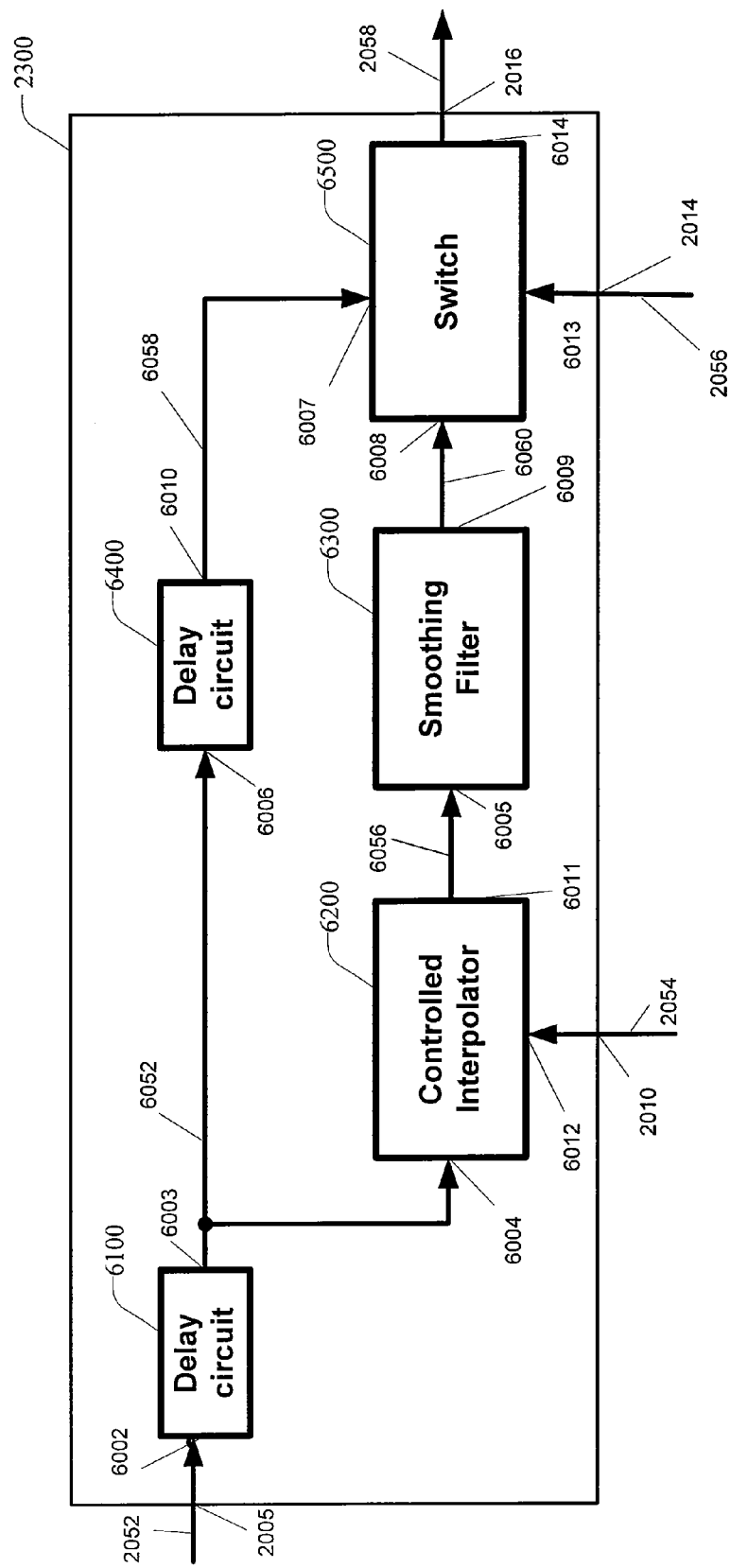
FIG. 6 illustrates an embodiment of a channel impulse noise remover.

FIG. 6 illustrates the impulse noise remover 2300 of FIG. 2. The impulse noise remover 2300 includes delay circuit 6100, delay circuit 6400, controlled interpolator 6200, smoothing filter 6300, and a switch 6500. Signal is processed by the impulse noise remover 2300 as follows: input signal 2052 is inputted to the impulse noise remover 2300 via input port 6002 of the delay circuit 6100. Signal 6052 is outputted from the delay circuit 6100 and fed, in parallel, to the delay circuit 6400 via input port 6006 and to the controlled interpolator 6200 via input port 6004. Input signal 2054 is inputted to the impulse noise remover 2300 via input port 6012 of the controlled interpolator 6200. Output signal 6056 is outputted from the controlled interpolator 6200 via output port 6011 and fed to the smoothing filter 6300 via input port 6005. Output signal 6060 is outputted from the smoothing filter 6300 via output port 6009 and fed to the switch 6500 via input port 6008. Input signal 2056 is inputted to the impulse noise remover 2300 via input port 6013 of the switch 6500. Output signal 6058 is outputted from the delay circuit 6400 via output port 6010 to the switch 6500 via input port 6007. Output signal 2058 is outputted from the impulse noise interpolator 2300 via output port 6014 of the switch 6500.

In an embodiment, the controlled interpolator 6200 transmits the impulse interference of a finite duration (strobes) in accordance with the control signal being fed, through the delay circuit 6100, as well as being fed to the controlled interpolator 6200. During impulse interference the behavior of the signal is determined by interpolating the received signal using a zero-order interpolator. In an embodiment, zero or first order interpolators are used to interpolate the received signal. The smoothing filter 6300 of the channel impulse noise remover 2300 is utilized as an LPF, the characteristics of which can be selected based on required order of a final signal interpolation during noise impulse. In an embodiment the delay circuit 6400 delays a signal 6052 by the time equal to the signal delay of the signal 6056 in the smoothing filter 6300.

In an embodiment, the impulse noise remover 2300 transmits, through the switch 6500, a signal from the delay circuit 6400 when the control signal is equal to "logic zero." Alternatively, the impulse noise remover 2300 transmits, through the switch 6500, a signal from the smoothing filter 6300 when the control signal is equal to "logic unit". In an embodiment, the switch 6500 is similar to the switch 5200 in controlled interpolator 3200 of FIG. 5. One skilled in the art will recognize that the system configuration of FIG. 6 is non-limiting and may include additional and/or desired components and/or configurations.

Figure 7:
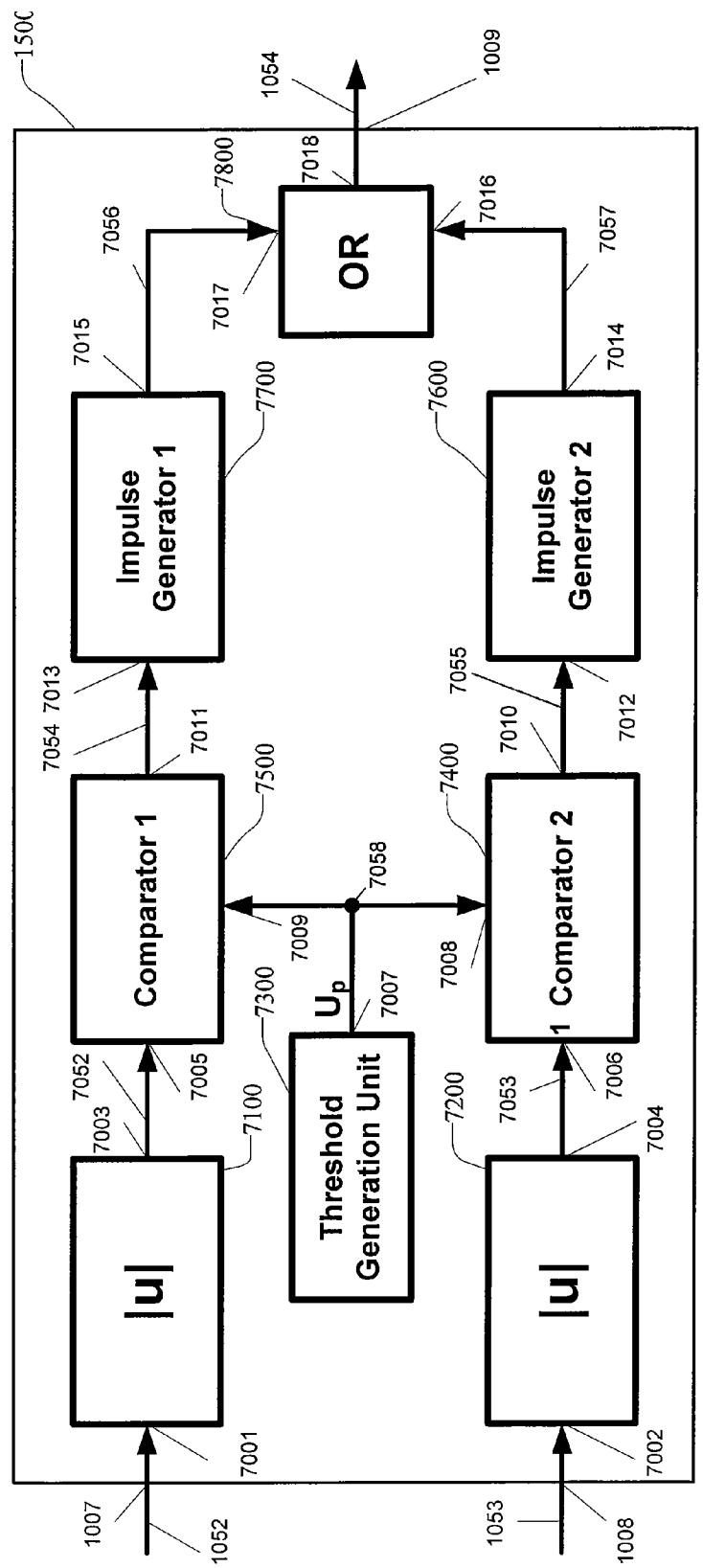
FIG. 7 illustrates an embodiment of a noise detection unit.

FIG. 7 illustrates noise detection unit 1500 of FIG. 1. The noise detection unit 1500 can be implemented as an embodiment of noise detection unit 2500 of FIG. 2. The noise detection unit 1500 includes two parallel channels. A first channel includes sequentially connected modulus (absolute value) calculation unit 7100 to calculate the absolute value, comparator 7500, and impulse generator 7700. A second channel includes sequentially connected modulus (absolute value) calculation unit 7200 to calculate the absolute value, comparator 7400, and impulse generator 7600. The noise detection unit 1500 also includes a threshold generation unit 7300 whose output 7007 is connected to a second input (input 7009) to the comparator 7500 and to a second input (input 7008) to the comparator 7400.

In an embodiment, modulus calculation units 7100 and 7200 calculate absolute values for signals received from each channel through respective inputs 7020 and 7030. Signals are processed in the noise detection unit 1500 as follows: input signal 1052 is fed to the noise detection unit 1500 via input port 7001 of the modulus calculation unit 7100. Output signal 7052, which includes values calculated in the modulus calculation unit 7100, is outputted via output port 7003 and fed to comparator 7500 via input port 7005. A threshold generation unit 7300 generates a signal 7058 which is outputted from the threshold generation unit 7300 via output port 7007 and fed, in parallel, to the comparator 7500 via input port 7009 and to the comparator 7400 via input port 7008. In the comparator 7500 a value within the signal 7052 is compared with the predetermined threshold value within the signal 7058 and is set in the comparator unit 7500.

In an embodiment, the threshold value generated by the threshold generation unit 7300 is normalized to the root-mean-square value of the binary signal. For example, the threshold can be calculated as $$U_p = 1 + U_n \sqrt{\frac{T_s}{\tau_p h_{sn}^2}}, \qquad (1)$$

Where $T_s$ is the duration of the channel symbol, $\tau_p$ is the average duration of noise impulse, $h_{sn}^2$ is the symbol signal-to-noise ratio SNR (current or predicted), $U_n$ is the coefficient dependent on SNR $h_{sn}^2$. $U_n$ can be within a range from 3 to 6 when SNR varies from 0 to 20 dB.

Output signal 7054 is outputted from the comparator 7500 via output port 7011 and fed to the impulse generator 7700.

The impulse duration at the output port 7011 of the comparator unit 7500 can be determined by the time of exceeding the predetermined threshold value by the noise impulse; therefore, the duration of these impulses is less than the actual duration of the noise impulse. To fully compensate for noise impulses in the impulse generator 7700, the duration of the impulses can be increased. Subsequently, generated control impulse 7056 is outputted from the impulse generator 7700 via output port 7015 and fed to the logic unit OR 7800 via input port 7017.

Similarly, input signal 1053 is fed to the noise detection unit 1500 via input port 7002 of the modulus calculation unit 7200. Output signal 7053, which includes values calculated in the modulus calculation unit 7200, is outputted via output port 7004 and fed to comparator 7400 via input port 7006. In the comparator 7400 a value within the signal 7053 is compared with the predetermined threshold value within the signal 7058 outputted by the threshold generation unit 7300 and is set in the comparator unit 7400.

Output signal 7055 is outputted from the comparator 7400 via output port 7010 and fed to the impulse generator 7600 via input port 7012. Subsequently, generated control impulse 7057 is outputted from the impulse generator 7600 via output port 7014 and fed to the logic unit OR 7800 via input port 7016. The output signal 1054 of the noise detection unit 1500 is then outputted from output port 7018 of the logic unit OR 7800.

Figure 8:
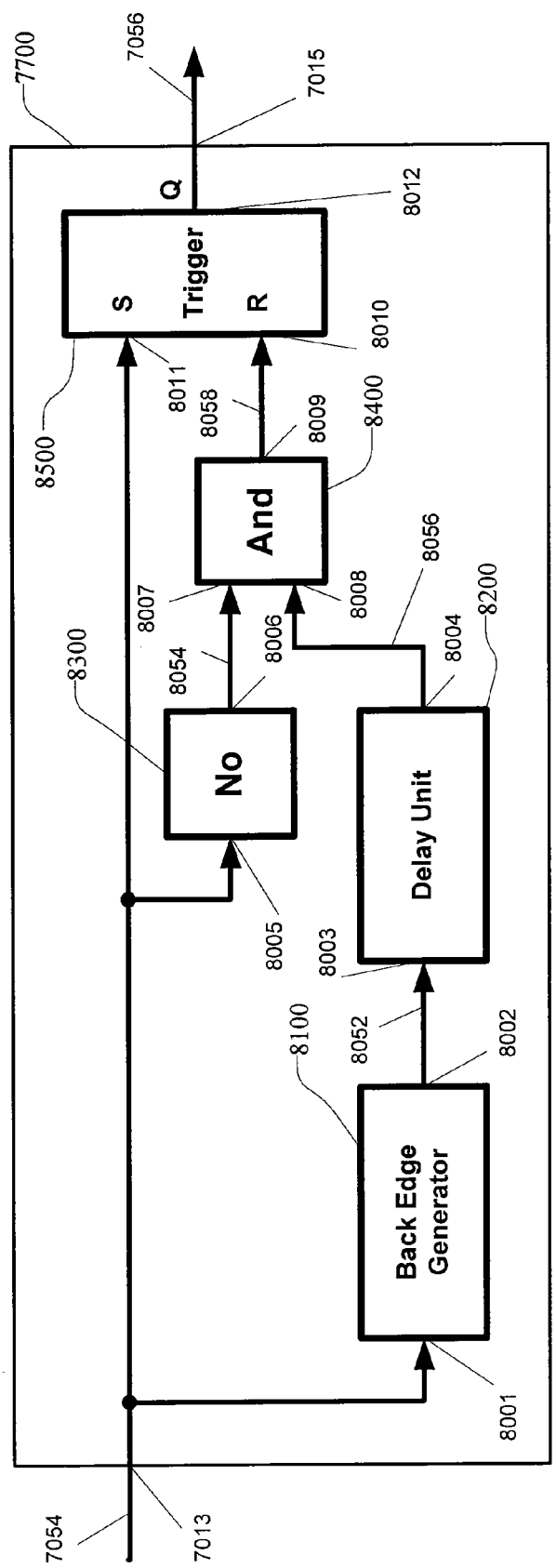
FIG. 8 illustrates an embodiment of an impulse generator.

FIG. 8 illustrates an impulse generator 7700. The impulse generator 7700 can also be implemented as an embodiment of impulse generators 7600 of FIG. 7. In an embodiment, the impulse generator 7700 includes back edge generator 8100, delay unit 8200, logic block AND 8400, logic block NO 8300, and a trigger 8500. Signal is processed by the impulse generator 7700 as follows: input signal 7054 is inputted to the impulse generator 7700, in parallel, via input port 8001 of the back edge generator 8100, input port 8005 of the logic block NO 8300, and input port 8011 of the trigger 8500. The output signal 8052 is outputted from the back edge generator 8100 via output port 8002 and fed to the delay unit 8200 via input port 8003. The output signal 8056 is outputted from the delay unit 8200 via output port 8004 and fed to the logic unit AND 8400 via input port 8008. The output signal 8054 is outputted from the logic unit NO 8300 via output port 8006 and fed to the logic unit AND 8400 via input port 8007. The logic unit AND 8400 outputs signal 8058 via output port 8009, where signal 8058 is fed to the trigger 8500 via input port 8010. The output signal 7056 is outputted from the impulse generator 7700 via output port 8012 of the trigger 8500.

In an embodiment, the trigger 8500 is set to the "logic unit" mode by the front edge of the input impulse. The back edge generator 8100 generates a short impulse corresponding to the back edge of the input impulse. This impulse is delayed by a predetermined time interval by the delay unit 8200 and resets the setting trigger 8500 to "logic zero" mode. In an embodiment, the logic units NO 8300 and AND 8400 are required to prevent the setting trigger 8500 from being reset at close input impulses, i.e., when the delayed back edge of one impulse overlaps the duration of the subsequent impulse.

Figure 9:
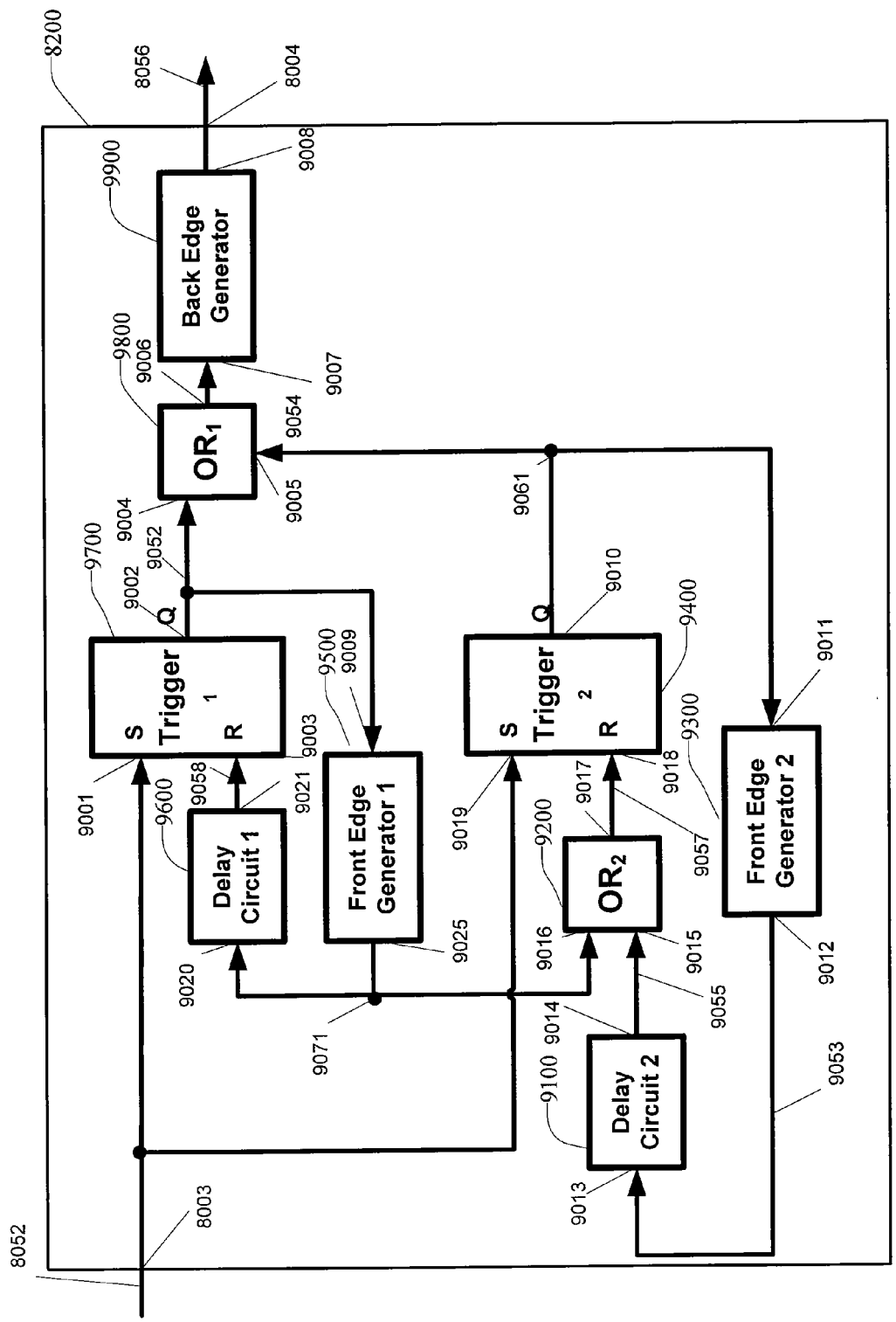
FIG. 9 illustrates an embodiment of a delay unit.

FIG. 9 illustrates an embodiment of a delay unit 8200. The delay unit 8200 can be implemented as the embodiment of the delay unit 8200 of FIG. 8. The delay unit 8200 includes two triggers 9400 and 9700, two logic blocks OR 9200 and 9800, a back edge generator 9900, two front edge generators 9300 and 9500, and two delay circuits 9100 and 9600. Signals in the delay unit 8200 are processed as follows: signal 8052 is inputted to the delay unit 8200 via input port 9001 of the trigger 9700 and to the trigger 9400 via input port 9019. The output signal 9052 is outputted from the trigger 9700 via output port 9002 and fed, in parallel, to the logic block OR 9800 via input port 9004 and to the front edge generator 9500 via input port 9009. The output signal 9071 is outputted from the front edge generator 9500 via output port 9025 and fed, in parallel, to the delay circuit 9600 via input port 9020 and to the logic block OR 9200 via input port 9016.

Output signal 9061 is outputted from the trigger 9400 via output port 9010 and fed, in parallel, to the logic block OR 9800 via input port 9005 and to the front edge generator 9300 via input port 9011. Output signal 9053 is outputted from the front edge generator 9300 via output port 9012 and fed to the delay circuit 9100 via input port 9013. Output signal 9055 is outputted from the delay circuit 9100 via output port 9014 and fed to the logic block OR 9200 via input port 9015. Output signal 9057 is outputted from the logic block OR 9200 via output port 9017 and fed to the trigger 9400 via input port 9018. Finally, output signal 8056 is outputted from the delay unit 8200 via output port 9008 of the back edge generator 9900.

In an embodiment, the input signal 8052 sets triggers 9700 and 9400 into "logic unit" mode. The front edge generator 9500 generates a short impulse corresponding to the front edge of the impulse at the output 9002 of trigger 9700. Said impulse with a delay assigned by the delay circuit 9600 resets the trigger 9700. It is to be understood that the value of delay in delay circuit 9600 can be selected greater or equal to the average noise impulse duration.

Since impulses with the following interval less than the delay value in the delay circuit 9600 can present at the input 9030 of the delay unit 8200, there is an additional parallel channel including trigger 9400, the front edge generator 9300, the delay circuit 9100, and logic unit OR 9200. The delay in the second delay circuit 9100 can be set being equal to the delay in first delay circuit 9600. Said channel, along with logic unit OR 9800 and the back edge generator 9900, provides generation of the output impulse delayed by an assigned value relative to the last of the closest pair of the input impulses.

Figure 10:
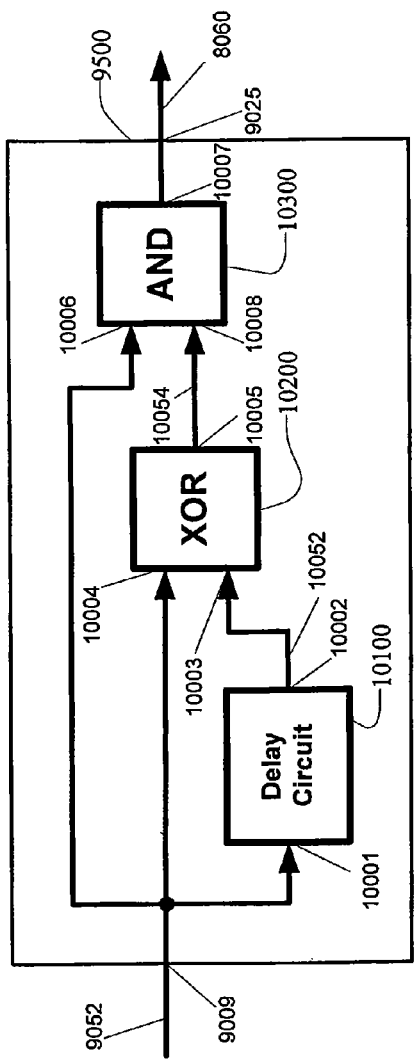
FIG. 10 illustrates an embodiment of a front edge generator.

FIG. 10 illustrates an embodiment of a front edge generator 9300 of FIG. 9. The front edge generator 9300 can be implemented as the embodiment of the front edge generator 9500 of FIG. 9. The front edge generator 9300 includes a delay circuit 10100, a logic block XOR 10200, and a logic block AND 10300. In an embodiment, signals are processed in the front edge generator 9300 as follows: the signal 9052 is inputted to the front edge generator 9300 via input port 10001 of the delay circuit 10100, via input port 10004 of the logic block XOR 10200, and via input port 10060 of the logic block AND 10300. Signal 10052 is outputted from the delay circuit 10100 via output port 10002 and fed to the logic block XOR 10200 via input port 10003. Signal 10054 is outputted from the logic block XOR 10200 via output port 10005 and fed to the logic block AND 10300 via input port 10008. Output signal 8060 from the logic block AND 10300 and the output signal from the front edge generator 9300. One skilled in the art will recognize that the system configuration of FIG. 9 is non-limiting and may include additional and/or desired components and/or configurations.

Figure 11:
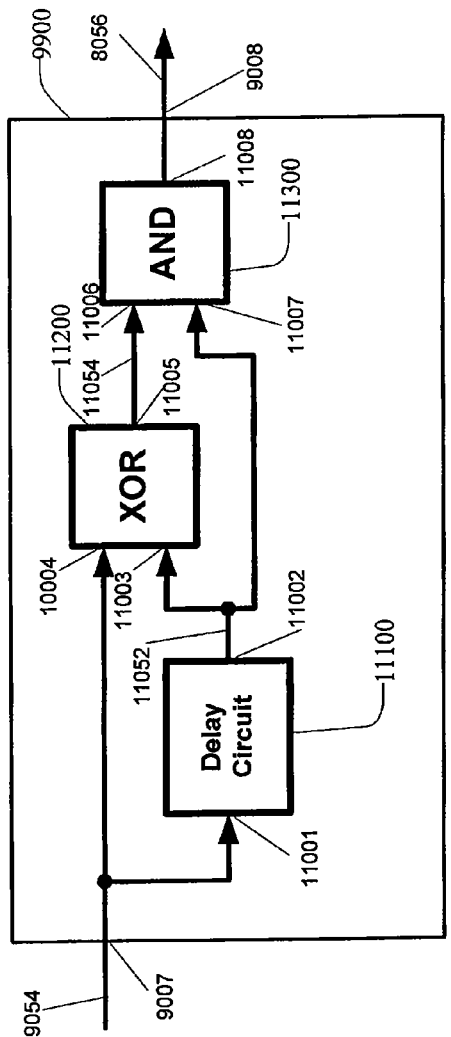
FIG. 11 illustrates an embodiment of a back edge generator.

FIG. 11 illustrates a back edge generator 9900 of the delay unit 8200. The back edge generator 9900 can be implemented as the embodiment of the back edge generator 8100 of FIG. 8. The back edge generator 9900 includes a delay circuit 11100, a logic block XOR 11200, and a logic block AND 11300. It is to be understood that, in discrete systems, delay circuit 11100 provides a one-clock delay.

In an embodiment, signals are processed in the back edge generator 9900 as follows: signal 9054 is inputted to the back edge generator 9900 via input port 11001 of the delay circuit 11100 and via input port 11004 of the logic block XOR 11200. The delay circuit 11100 outputs signal 11052, in parallel, to the logic block XOR 11200 via input port 11003 and to the logic block AND 11300 via input port 11007. The logic block XOR 11200 outputs signal 11054 via output port 11005 to the logic block AND 11300 via input port 11006. The logic block AND 11300. The output signal 8056 from the logic block AND 11300 via output port 11008 is the output signal from the back edge generator 9900.

Figure 12:
FIG. 12 illustrates exemplary signal profiles illustrating operation of a quadrature impulse noise remover.

FIG. 12 shows examples of signal profiles. These profiles illustrate the operation of impulse noise remover 2 (FIG. 6). The signal profiles are provided for the signals designated as 6052, 2054, and 2058 in FIG. 6. These signals represent respectively: the received signal before compensating for impulse noise (signal 6052), the signal at the output of noise detection unit 1500 (point 2054), and signal at the output of impulse noise remover 2300 (point 2058). The profiles in FIG. 12 are provided for one of quadrature signals. It can be observed that the proposed apparatus efficiently removes impulse interference present in the channel.

The foregoing Detailed Description is to be understood as being in every respect illustrative and exemplary, but not restrictive, and the scope of the invention disclosed herein is not to be determined from the Detailed Description, but rather from the claims as interpreted according to the full breadth permitted by the patent laws. It is to be understood that the embodiments shown and described herein are only illustrative of the principles of the present invention and that various modifications may be implemented by those skilled in the art without departing from the scope and spirit of the invention. Those skilled in the art could implement various other feature combinations without departing from the scope and spirit of the invention.

The invention claimed is:

1. An apparatus for quadrature impulse noise removal, the apparatus comprising:
    a first low pass filter configured to:
        receive an input in-phase signal comprising a predetermined in-phase signal and first impulse noise; and
        generate a filtered input in-phase signal;
    a second low pass filter configured to:
        receive an input quadrature signal comprising a predetermined quadrature signal and second impulse noise; and
        generate a filtered input quadrature signal;
    a noise detection unit configured to:
        receive the filtered in-phase signal;
        receive the filtered quadrature signal; and
        based on the filtered in-phase signal and the filtered quadrature signal, generate a control signal which is synchronized in time with the first impulse noise and the second impulse noise;
    a first channel impulse noise remover configured to:
        receive the filtered in-phase signal;
        receive the control signal; and
        based on the control signal, remove the first impulse noise from the filtered in-phase signal and output the predetermined in-phase signal; and
    a second channel impulse noise remover configured to:
        receive the filtered quadrature signal;
        receive the control signal; and
        based on the control signal, remove the first impulse noise from the filtered quadrature signal and output the predetermined quadrature signal.

2. The apparatus of claim 1, further comprising:
    a control impulse generator configured to:
        substitute a portion of the control signal received from the noise detection unit with a function obtained from a signal in which an impulse interference is replaced by a zero-order interpolator.

3. The apparatus of claim 2, wherein the control impulse generator comprises a smoothing filter and a relay circuit, wherein:
    an input to the control impulse generator is an input to the smoothing filter,
    an output from the smoothing filter is an input to the relay circuit, and
    an output from the relay circuit is the output from the control impulse generator.

4. The apparatus of claim 2, wherein the control impulse generator comprises a smoothing filter and a relay circuit, wherein:
    an input to the control impulse generator is an input to the smoothing filter,
    an output from the smoothing filter is an input to the relay circuit, and
    an output from the relay circuit is the output from the control impulse generator.

5. The apparatus of claim 1, wherein each of the first channel impulse noise remover and the second channel impulse noise remover comprises:
    a first delay circuit, wherein the first delay circuit comprises at least one input and at least one output, the at least one input to the first delay circuit is the input to each of the in-phase channel impulse noise remover and the quadrature channel impulse noise remover, the at least one output from the first delay circuit is an input to each of the second delay circuit and the controlled interpolator;
    a second delay circuit, wherein the second delay circuit comprises at least one input and at least one output, the at least one input to the second delay circuit is an output from the first delay circuit, the at least one output from the second delay circuit is an input to the switch;
    a controlled interpolator, wherein the controlled interpolator comprises a plurality of inputs and at least one output, the at least one of the plurality of inputs to the controlled interpolator is an output from the first delay circuit, the at least one other of the plurality of inputs to the controlled interpolator is an input from the noise detection unit, the at least one output from the controlled interpolator is an input to the smoothing filter;
    a smoothing filter, wherein the smoothing filter comprises at least one input and at least one output, the at least one input to the smoothing filter is the output from the controlled interpolator, the at least one output from the smoothing filter is an input to the switch, and;
    a switch, wherein the switch comprises a plurality of inputs and at least one output, a first of the plurality of inputs to the switch is an output from the second delay circuit, a second of the plurality of inputs to the switch is an output from the smoothing filter, a third of the plurality of inputs to the switch is an output from the control impulse generator, the at least one output from the switch is an output from each of the in-phase channel impulse noise remover and the quadrature channel impulse noise remover.

6. The apparatus of claim 5, wherein the controlled interpolator comprises a sample and hold unit and a switch, wherein the sample and hold unit comprises a plurality of inputs and at least one output, at least one of the plurality of inputs to the sample and hold unit is a first input to the controlled interpolator, at least one other of the plurality of inputs to the sample and hold unit is a second input to the controlled interpolator, the at least one output from the sample and hold unit is a first input to the switch, wherein the switch comprises a plurality of inputs and at least one output, a first of the plurality of inputs to the switch is the at least one output of the sample and hold unit, a second of the plurality of inputs to the switch is the first input to the controlled interpolator, a third of the plurality of inputs to the switch is the second input to the controlled interpolator.

7. The apparatus of claim 1, wherein the noise detection unit comprises:
   a threshold generation unit;
   a logic block; and
   a first channel and a second channel, each of the first channel and the second channel comprising a modulus calculation unit, a comparator, and an impulse generator, wherein each of the first channel and the second channel is connected to the logic block and wherein an output of the threshold generation unit is at least one input to each comparator of the first channel and of the second channel.

8. The apparatus of claim 7, wherein the impulse generator of each of the first channel and the second channel comprises a back edge generator, a delay unit, a first logic block, a second logic block, and a trigger, wherein the input to the impulse generator is at least one input to the back edge generator, the first logic block, and the trigger, wherein an output from the back edge generator is an input to the delay unit, wherein an output from the delay unit is a first input to the second logic block, wherein an output from the second logic block is an input to the trigger, wherein the output from the trigger is the output from the impulse generator of each of the first channel and of the second channel, wherein an output from the first logic block is a second input to the second logic block.

9. The apparatus of claim 8, wherein the delay unit comprises:
   a plurality of triggers;
   a plurality of logic blocks;
   a back edge generator;
   a plurality of front edge generators; and
   a plurality of delay circuits, wherein the input to the delay unit is an input to the plurality of triggers, wherein an output from a first of the plurality of triggers is an input to: (i) a first of the plurality of logic blocks and (ii) a first of the plurality of delay circuits via a first of the plurality of front edge generators, wherein an output from the first of the plurality of delay circuits is a second input to the first of the plurality of triggers,
   wherein an output from a second of the plurality of triggers is an input to: (i) the first of the plurality of logic blocks and (ii) the second of the plurality of logic blocks via sequentially connected a second of the plurality of front edge generators and a second of the plurality of delay circuits, wherein the second of the plurality of logic blocks has a second input from the first of the plurality of front edge generators, wherein an output from the second of the plurality of logic blocks is an input to the second of the plurality of triggers, wherein an output from the first of the plurality of logic blocks is an input to the back edge generator, and wherein the output from the back edge generator is the output from the delay unit.

10. The apparatus of claim 9, wherein each of the plurality of front edge generators comprises:
    a delay circuit; and
    a plurality of logic units, wherein the input to the front edge generator is an input to the delay circuit and to each of the plurality of logic units, wherein an output from the delay circuit is an input to a first of the plurality of logic units, wherein an output from the first of the plurality of logic units is an input to the second of the plurality of logic units, and wherein an output from the second of the plurality of logic units is the output from each of the plurality of front edge generators.

11. The apparatus of claim 9, wherein each of the plurality of back edge generators comprises:
    a delay circuit; and
    a plurality of logic units, wherein the input to each of the plurality back edge generators is: (i) an input to the delay circuit and (ii) a first of the plurality of inputs to a first of the plurality of logic units, wherein an output from the delay circuit is a second of the plurality of inputs to the first of the plurality of logic units, wherein an output from the first of the plurality of logic units is a first of the plurality of inputs to the second of the plurality of logic units, wherein the output from the delay circuit is a second of the plurality of inputs to the second of the plurality of logic units, and wherein an output from the second of the plurality of logic units is the output from each of the plurality of back edge generators.

12. An apparatus for quadrature impulse noise removal, the apparatus comprising:
    a first low pass filter configured to:
       receive an input in-phase signal comprising a predetermined in-phase signal and first impulse noise; and
       generate a filtered input in-phase signal;
    a second low pass filter configured to:
       receive an input quadrature signal comprising a predetermined quadrature signal and second impulse noise; and
       generate a filtered input quadrature signal;
    a noise detection unit configured to:
       receive the filtered in-phase signal;
       receive the filtered quadrature signal; and
       based on the filtered in-phase signal and the filtered quadrature signal, generate a control signal;
    a first channel impulse noise remover configured to:
       receive the filtered in-phase signal;
       receive the control signal; and
       based on the control signal, remove the first impulse noise from the filtered in-phase signal and output the predetermined in-phase signal; and
    a second channel impulse noise remover configured to:
       receive the filtered quadrature signal;
       receive the control signal; and
       based on the control signal, remove the first impulse noise from the filtered quadrature signal and output the predetermined quadrature signal; and
    wherein each of the first channel impulse noise remover and the second channel impulse noise remover comprises:
    a delay circuit, the delay circuit comprises at least one input and at least one output, wherein the at least one input to the delay circuit is the input to each of the in-phase channel impulse noise remover and the quadrature channel impulse noise remover; and
    a controlled interpolator, the controlled interpolator comprises a plurality of inputs and at least one output, wherein at least one of the plurality of inputs to the controlled interpolator is the at least one output from the delay circuit, wherein at least one other of the plurality of inputs to the controlled interpolator is an output from at least one other source, wherein the at least one output from the controlled interpolator is the output from each of the in-phase channel impulse noise remover and the quadrature channel impulse noise remover.

13. A method for quadrature impulse noise removal comprising:
- receiving, by a first low pass filter, an input in-phase signal comprising a predetermined in-phase signal and first impulse noise;
- generating, by the first low pass filter, a filtered input in-phase signal;
- receiving, by a second low pass filter, an input quadrature signal comprising a predetermined quadrature signal and second impulse noise;
- generating, by the second low pass filter, a filtered input quadrature signal;
- receiving, by a noise detection unit, the filtered in-phase signal and the filtered quadrature signal;
- based on the filtered in-phase signal and the filtered quadrature signal, generating, by the noise detection unit, a control signal which is synchronized in time with the first impulse noise and the second impulse noise;
- receiving, by a first channel impulse noise remover, the filtered in-phase signal and the control signal;
- based on the control signal, removing, by the first channel impulse noise remover, the first impulse noise from the filtered in-phase signal and output the predetermined in-phase signal;
- receiving, by a second channel impulse noise remover, the filtered quadrature signal;
- receiving, by the second channel impulse noise remover, the control signal; and
- based on the control signal, removing, by the second channel impulse noise remover, the first impulse noise from the filtered quadrature signal and output the predetermined quadrature signal.

14. The method of claim 13, further comprising:
- generating, by a control impulse generator, a secondary control signal by substituting a portion of the received signal with a function obtained from a signal comprising impulse interference compensated by a zero-order interpolation.

15. The method of claim 13, wherein each of the first channel impulse noise remover and the second channel impulse noise remover comprises:
- a first delay circuit, wherein the first delay circuit comprises at least one input and at least one output, the at least one input to the first delay circuit is the input to each of the in-phase channel impulse noise remover and the quadrature channel impulse noise remover, the at least one output from the first delay circuit is an input to each of the second delay circuit and the controlled interpolator;
- a second delay circuit, wherein the second delay circuit comprises at least one input and at least one output, the at least one input to the second delay circuit is an output from the first delay circuit, the at least one output from the second delay circuit is an input to the switch;
- a controlled interpolator, wherein the controlled interpolator comprises a plurality of inputs and at least one output, the at least one of the plurality of inputs to the controlled interpolator is an output from the first delay circuit, the at least one other of the plurality of inputs to the controlled interpolator is an input from the noise detection unit, the at least one output from the controlled interpolator is an input to the smoothing filter;
- a smoothing filter, wherein the smoothing filter comprises at least one input and at least one output, the at least one input to the smoothing filter is the output from the controlled interpolator, the at least one output from the smoothing filter is an input to the switch, and;
- a switch, wherein the switch comprises a plurality of inputs and at least one output, a first of the plurality of inputs to the switch is an output from the second delay circuit, a second of the plurality of inputs to the switch is an output from the smoothing filter, a third of the plurality of inputs to the switch is an output from the control impulse generator, the at least one output from the switch is an output from each of the in-phase channel impulse noise remover and the quadrature channel impulse noise remover.

16. The method of claim 15, wherein the controlled interpolator comprises a sample and hold unit and a switch, wherein the sample and hold unit comprises a plurality of inputs and at least one output, at least one of the plurality of inputs to the sample and hold unit is a first input to the controlled interpolator, at least one other of the plurality of inputs to the sample and hold unit is a second input to the controlled interpolator, the at least one output from the sample and hold unit is a first input to the switch, wherein the switch comprises a plurality of inputs and at least one output, a first of the plurality of inputs to the switch is the at least one output of the sample and hold unit, a second of the plurality of inputs to the switch is the first input to the controlled interpolator, a third of the plurality of inputs to the switch is the second input to the controlled interpolator.

17. The method of claim 13, wherein the noise detection unit comprises:
- a threshold generation unit;
- a logic block; and
- a first channel and a second channel, each of the first channel and the second channel comprising a modulus calculation unit, a comparator, and an impulse generator, wherein each of the first channel and the second channel is connected to the logic block and wherein an output of the threshold generation unit is at least one input to each comparator of the first channel and of the second channel.

18. The method of claim 17, wherein the impulse generator of each of the first channel and the second channel comprises a back edge generator, a delay unit, a first logic block, a second logic block, and a trigger, wherein the input to the impulse generator is at least one input to the back edge generator, the first logic block, and the trigger, wherein an output from the back edge generator is an input to the delay unit, wherein an output from the delay unit is a first input to the second logic block, wherein an output from the second logic block is an input to the trigger, wherein the output from the trigger is the output from the impulse generator of each of the first channel and of the second channel, wherein an output from the first logic block is a second input to the second logic block.

19. The method of claim 18, wherein the delay unit comprises:
- a plurality of triggers;
- a plurality of logic blocks;
- a back edge generator;
- a plurality of front edge generators; and
- a plurality of delay circuits, wherein the input to the delay unit is an input to the plurality of triggers, wherein an output from a first of the plurality of triggers is an input to: (i) a first of the plurality of logic blocks and (ii) a first of the plurality of delay circuits via a first of the plurality of front edge generators, wherein an output from the first of the plurality of delay circuits is a second input to the first of the plurality of triggers, wherein an output from a second of the plurality of triggers is an input to: (i) the first of the plurality of logic blocks and (ii) the second of the plurality of logic blocks via sequentially connected a second of the plurality of front edge generators and a second of the plurality of delay circuits, wherein the second of the plurality of logic blocks has a second input from the first of the plurality of front edge generators, wherein an output from the second of the plurality of logic blocks is an input to the second of the plurality of triggers, wherein an output from the first of the plurality of logic blocks is an input to the back edge generator, and wherein the output from the back edge generator is the output from the delay unit.

20. The method of claim 19, wherein each of the plurality of front edge generators comprises:
a delay circuit; and
a plurality of logic units, wherein the input to the front edge generator is an input to the delay circuit and to each of the plurality of logic units, wherein an output from the delay circuit is an input to a first of the plurality of logic units, wherein an output from the first of the plurality of logic units is an input to the second of the plurality of logic units, and wherein an output from the second of the plurality of logic units is the output from each of the plurality of front edge generators.

21. The method of claim 19, wherein each of the back edge generator comprises:
a delay circuit; and
a plurality of logic units, wherein the input to each of the plurality back edge generators is: (i) an input to the delay circuit and (ii) a first of the plurality of inputs to a first of the plurality of logic units, wherein an output from the delay circuit is a second of the plurality of inputs to the first of the plurality of logic units, wherein an output from the first of the plurality of logic units is a first of the plurality of inputs to the second of the plurality of logic units, wherein the output from the delay circuit is a second of the plurality of inputs to the second of the plurality of logic units, and wherein an output from the second of the plurality of logic units is the output from each of the plurality of back edge generators.

22. A method for quadrature impulse noise removal comprising:
receiving, by a first low pass filter, an input in-phase signal comprising a predetermined in-phase signal and first impulse noise;
generating, by the first low pass filter, a filtered input in-phase signal;
receiving, by a second low pass filter, an input quadrature signal comprising a predetermined quadrature signal and second impulse noise;
generating, by the second low pass filter, a filtered input quadrature signal;
receiving, by a noise detection unit, the filtered in-phase signal and the filtered quadrature signal;
based on the filtered in-phase signal and the filtered quadrature signal, generating, by the noise detection unit, a control signal which is synchronized in time with the first impulse noise and the second impulse noise:
receiving, by a first channel impulse noise remover, the filtered in-phase signal and the control signal;
based on the control signal, removing, by the first channel impulse noise remover, the first impulse noise from the filtered in-phase signal and output the predetermined in-phase signal;
receiving, by a second channel impulse noise remover, the filtered quadrature signal;
receiving, by the second channel impulse noise remover, the control signal; and
based on the control signal, removing, by the second channel impulse noise remover, the first impulse noise from the filtered quadrature signal and output the predetermined quadrature signal; and
wherein each of the first channel impulse noise remover and the second channel impulse noise remover comprises:
a delay circuit, the delay circuit comprises at least one input and at least one output, wherein the at least one input to the delay circuit is the input to each of the in-phase channel impulse noise remover and the quadrature channel impulse noise remover; and
a controlled interpolator, the controlled interpolator comprises a plurality of inputs and at least one output, wherein at least one of the plurality of inputs to the controlled interpolator is the at least one output from the delay circuit, wherein at least one other of the plurality of inputs to the controlled interpolator is an output from at least one other source, wherein the at least one output from the controlled interpolator is the output from each of the in-phase channel impulse noise remover and the quadrature channel impulse noise remover.

* * * * *